United States Patent
Acimovic et al.

(10) Patent No.: US 8,653,889 B1
(45) Date of Patent: Feb. 18, 2014

(54) DOHERTY AMPLIFIER HAVING COMPACT OUTPUT MATCHING AND COMBINING NETWORKS

(75) Inventors: Igo Acimovic, Gatineau (CA); Brian Racey, Ottawa (CA)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 13/605,106

(22) Filed: Sep. 6, 2012

(51) Int. Cl.
*H03F 3/68* (2006.01)

(52) U.S. Cl.
USPC ............. 330/124 R; 330/295; 330/302

(58) Field of Classification Search
USPC .................... 330/124 R, 295, 302
See application file for complete search history.

(56) References Cited

U.S. PATENT DOCUMENTS

| | | | |
|---|---|---|---|
| 6,262,629 B1 * | 7/2001 | Stengel et al. | 330/124 R |
| 6,320,462 B1 * | 11/2001 | Alley | 330/124 R |
| 8,188,789 B2 * | 5/2012 | Woo et al. | 330/124 R |
| 8,441,326 B1 * | 5/2013 | Bromberger | 333/32 |
| 2010/0315162 A1 | 12/2010 | Gajadharsing et al. | |

FOREIGN PATENT DOCUMENTS

EP 2159912 A1 3/2010

OTHER PUBLICATIONS

Kim, B., et al., "The Doherty Power Amplifier," Micorwave Magazine, IEEE, vol. 7, No. 5, Oct. 2006, pp. 42-50.
International Search Report and Written Opinion; Mailed Nov. 25, 2013 for the corresponding PCT Application No. PCT/CA2013/050657.

* cited by examiner

*Primary Examiner* — Patricia Nguyen
(74) *Attorney, Agent, or Firm* — Steve Mendelsohn; Mendelsohn, Drucker & Dunleavy, P.C.

(57) ABSTRACT

A Doherty amplifier having a main amplifier branch and one or more peak amplifier branches, where the functionality and structure of the cascade of the main output matching network, the main offset line, and the quarter-wave transformer of the main amplifier branch of a conventional Doherty amplifier are subsumed into the main output matching network of the main amplifier branch, and the functionality and structure of each cascade of the peak output matching network and the peak offset line of each peak amplifier branch of a conventional Doherty amplifier are subsumed into the peak output matching network of the corresponding peak amplifier branch. Furthermore, the output quarter-wave transformer can be replaced by a wideband node matching network that does not have to perform frequency inversion.

19 Claims, 7 Drawing Sheets

DOHERTY AMPLIFIER HAVING COMPACT OUTPUT MATCHING AND COMBINING NETWORKS

BACKGROUND

1. Field

The present invention relates to electronics and, more specifically but not exclusively, to Doherty amplifiers.

2. Description of the Related Art

This section introduces aspects that may help facilitate a better understanding of the invention(s). Accordingly, the statements of this section are to be read in this light and are not to be understood as admissions about what is in the prior art or what is not in the prior art.

The best solution for the amplification of RF signals in modern telecommunication systems is currently based on the Doherty amplifier architecture, which consists of a main amplifier branch and one or more peak amplifier branches whose signals are combined through a network of one or more quarter-wave transformers and delivered to a load. The Doherty amplifier architecture utilizes a load-pulling effect between the main and peak amplifier branches to modulate the load impedance seen by the main amplifier branch in accordance with the instantaneous input RF power, which results in higher amplifier efficiency.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

Figure 1:
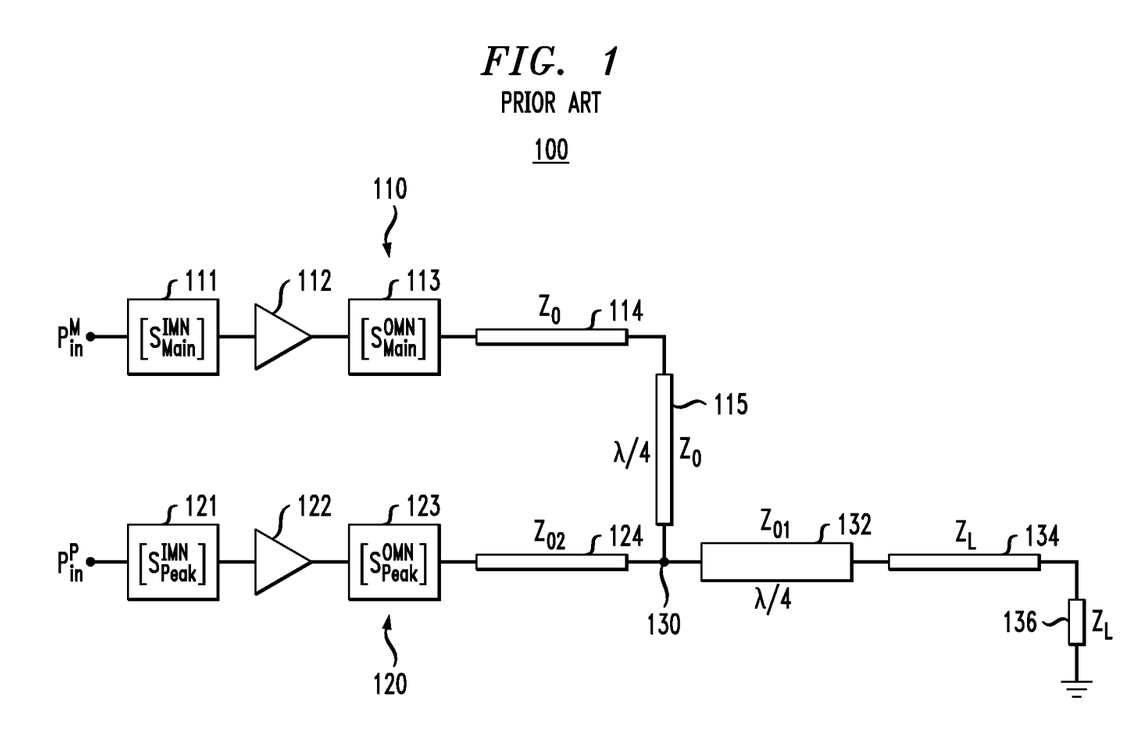
FIG. 1 shows a block diagram of a conventional two-way Doherty amplifier.

FIG. 1 shows a block diagram of a conventional two-way Doherty amplifier 100 having a main amplifier branch 110 and a peak amplifier branch 120. Main amplifier branch 110 consists of a cascade of a main input matching network 111, a main amplifier device (e.g., transistor) 112, a main output matching network 113, a main offset line 114, and a quarter-wave transformer 115, while peak amplifier branch 120 consists of a cascade of a peak input matching network 121, a peak amplifier device (e.g., transistor) 122, a peak output matching network 123, and a peak offset line 124. Output signals from the main and peak amplifier branches are combined at node 130 where branches 110 and 120 meet, and the resulting combined signal is delivered to the load 136 through a network consisting of a cascade of an output quarter-wave transformer 132 and a connecting line 134.

For a typical implementation of Doherty amplifier 100, for a particular signal frequency (or one or more particular ranges of signal frequencies), main and peak input matching networks 111 and 121 perform impedance transformation to convert from the relatively high impedance levels upstream of amplifier 100 down to relatively low impedance levels suitable for appropriate power transfer to (appropriate excitation of) main and peak amplifier devices 112 and 122. Similarly, main and peak output matching networks 113 and 123 perform a second impedance transformation to convert from the relatively low impedance levels of main and peak amplifier devices 112 and 122 back to relatively high impedance levels to achieve appropriate power extraction (or to achieve appropriate power delivery) from the devices. Note that, in general, the different impedance levels associated with main amplifier branch 110 may be, but do not have to be the same as the corresponding impedance levels associated with peak amplifier branch 120.

Main and peak offset lines 114 and 124 function as delays that apply phase rotations to their applied signals. Quarter-wave transformer 115 performs impedance inversion. For example, for a particular design and a particular signal frequency, quarter-wave transformer 115 performs impedance inversion whereby (i) input impedance levels below a particular impedance level $Z_0$ (e.g., 25 ohms) are converted into corresponding output impedance levels above that impedance level $Z_0$ (e.g., 100 ohms), and vice versa, while (ii) an input impedance at that impedance level $Z_0$ is output at that same impedance level. Output quarter-wave transformer 132 performs another impedance transformation to ensure that the output impedance of Doherty amplifier 100 matches the load impedance $Z_L$.

The input impedance matching networks 111 and 121 are implemented to enable proper RF power delivery to amplifier devices 112 and 122. The elements 113, 114, 115, 123, and 124 are implemented to provide high-efficiency impedance at low output power for the main amplifier device 112 and to enable high power delivery from both the main and peak amplifier devices 112 and 122 at high output power. Element 132 is implemented to transform load impedance (usually 50 ohm) to an appropriate impedance for combining node 130.

Figure 2:
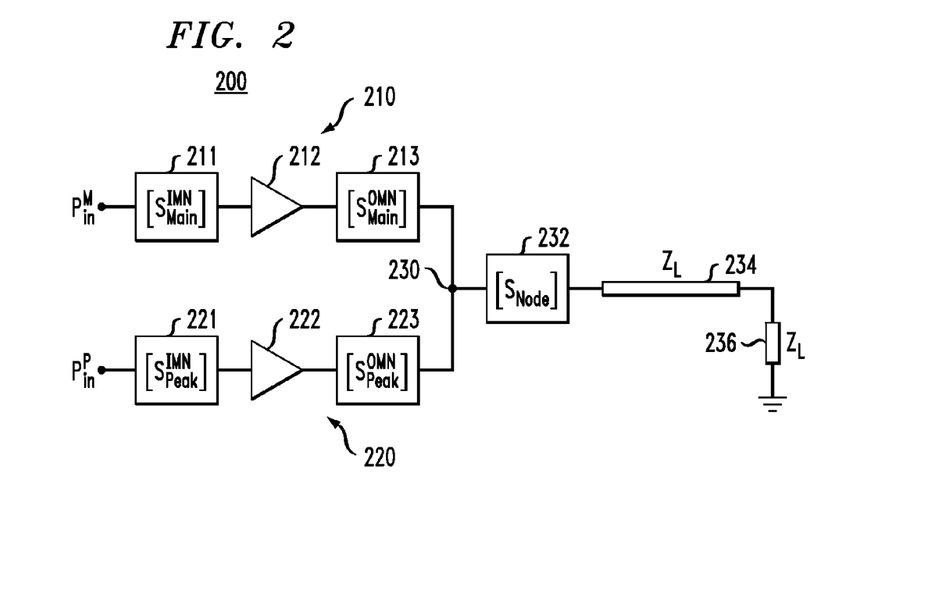
FIG. 2 shows a block diagram of a two-way Doherty amplifier according to one embodiment of the disclosure.

FIG. 2 shows a block diagram of a two-way Doherty amplifier 200 according to one embodiment of the disclosure having a main amplifier branch 210 and a peak amplifier branch 220. Main amplifier branch 210 consists of a cascade of a main input matching network 211, a main amplifier device (e.g., transistor) 212, and a main output matching network 213, while peak amplifier branch 220 consists of a cascade of a peak input matching network 221, a peak amplifier device (e.g., transistor) 222, and a peak output matching network 223. Output signals from the main and peak amplifier branches are combined at node 230 where branches 210 and 220 meet, and the resulting combined signal is delivered to the load 236 through a network consisting of a cascade of node matching network 232 and connecting line 234.

For a typical implementation of Doherty amplifier 200, for a particular signal frequency (or one or more particular ranges of signal frequencies), main and peak input matching networks 211 and 221 and main and peak amplifier devices 212 and 222 function analogously to the corresponding elements in Doherty amplifier 100 of FIG. 1. Significantly, however, in Doherty amplifier 200, main output matching network 213 is specifically designed to simultaneously perform the impedance transformation function of main output matching network 113 of Doherty amplifier 100, the function of main offset line 114 of Doherty amplifier 100, and the impedance inversion function of quarter-wave transformer 115 of Doherty amplifier 100. Since the impedance transformation and impedance inversion functions are subsumed into a single element, the phase rotation function of main offset line 114 of Doherty amplifier 100 is either not needed or is also subsumed into the design of main output matching network 213.

Similarly, the phase rotation function of peak offset line 124 of Doherty amplifier 100 is either not needed or is subsumed into the design of peak output matching network 223.

Furthermore, since main amplifier branch 210 does not explicitly include a quarter-wave transformer and also has no offset line, the main output matching network 213 can be designed to be broadband, and the output quarter-wave transformer 132 of Doherty amplifier 100 is replaced by node matching network 232, which performs an appropriate wideband impedance transformation, thus increasing the overall bandwidth of the Doherty amplifier.

In one possible implementation of Doherty amplifier 200, for an operating signal frequency of 700 MHz, main and peak input matching networks 211 and 221 transform impedances from 50 ohms to 2 ohms. Main output matching network 213 transforms impedances from 2 ohms to 25 ohms for the high efficiency condition, and from 1 ohm to 50 ohms for the high power condition. Peak output matching network 223 transforms the OFF-state impedance of the device to open circuit, and from 1 ohm to 50 ohm for the high power condition. The node matching network 232 transforms impedances from 25 ohms to 50 ohms. Of course, in other implementations, other operating frequencies and/or other sets of impedance levels are also possible.

Figure 3:
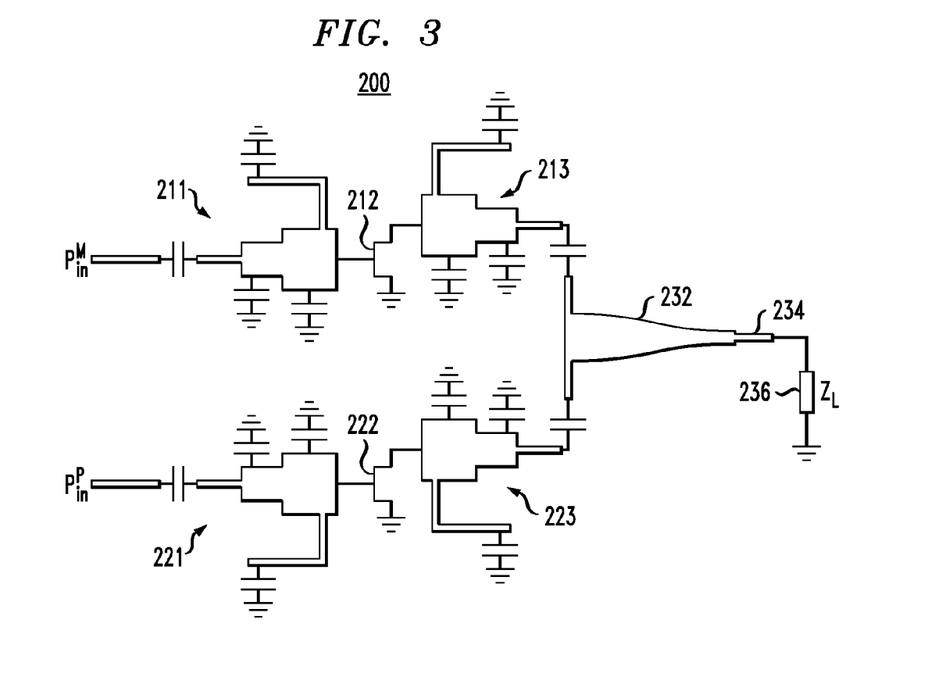
FIG. 3 shows a schematic diagram of the layout of one possible implementation of the two-way Doherty amplifier of FIG. 2.

FIG. 3 shows a schematic diagram of the layout of one possible implementation of two-way Doherty amplifier 200 of FIG. 2. Note that, although the layouts of matching networks 211, 213, 221, and 223 are all represented in FIG. 3 as inverted or rotated versions of one another, in typical real-world implementations, those four elements will not have the same shape. Furthermore, although those four matching networks are all represented as three-stage transmission lines terminated by three capacitors, other topologies having other numbers of stages and/or other numbers and/or types of terminating elements, such as inductors, are also possible, depending on the desired operating characteristics of those matching networks, including two or more different topologies for the four different matching networks. Note further that the tapered topology of wideband node matching network 232 contributes to its frequency insensitivity.

Depending on the particular implementation, two-way Doherty amplifier 200 of FIG. 2 may provide one or more of the following advantages over conventional two-way Doherty amplifier 100 of FIG. 1:

Reduced insertion loss and less waste heat generated;
Lower impedance spread over frequency and wider frequency bandwidth of operation;
Smaller amplifier footprint and PCB (printed circuit board) layout;
Lower PCB cost;
Higher factory yield; and
Easier fabrication and tuning.

In particular, the design of the main and peak output matching networks 213 and 223 may be optimized for maximal frequency bandwidth and minimal insertion loss, as well as minimal occupied real-estate by reducing the overall size (length) of the network for each branch. Depending on the implementation, such optimizations may be automated, manual, calculated, etc.

The main matching network optimization is performed to satisfy two conditions simultaneously. The first condition is to transform the combining node impedance (lightly loaded by the OFF-state impedance of the peak branch) to a high-efficiency impedance at the main amplifier device, and the second condition is to transform the modulated combining node impedance (the impedance will be higher compared to the previous case due to power contribution from the peak branch) to high-power impedance at the main amplifier device.

The peak matching network optimization is performed to satisfy two conditions simultaneously. The first condition is to transform the OFF-state impedance of the peak device to a high impedance to avoid excessive loading of the combining node, and the second condition is to transform the modulated combining node impedance (the impedance will be modulated due to power contribution from the main branch) to high-power impedance at the peak device.

In conventional Doherty amplifier 100, implementing the main branch output network as three distinct, cascaded parts, i.e., matching network 113, offset line 114, and impedance inverter 115, separates design variables and makes it easier to design each part in the Smith Chart "by hand," where impedance inverter 115 is included by default even though it can be demonstrated that it is not even necessary in some cases. A similar procedure can be performed for a network in which the impedance inverter is omitted if the assumptions about the main branch load impedance are accordingly changed.

A network, such as main output matching network 213 of Doherty amplifier 200, that combines the functionality of a matching network, an offset line, and an impedance inverter into one element can be implemented with the aid of an optimizer for the best results to be achieved (most compact, most broadband, etc.). The process involves determining proper impedance values for low-power conditions (high efficiency) and high-power conditions (high power) based on power amplifier specifications and transistor characteristics over frequency. The selection is such that desired performance can be achieved under the specified conditions and is subject to tradeoffs between conflicting performance parameters.

A two-way Doherty amplifier can be extended into a three-way Doherty amplifier having a main amplifier branch and two peak amplifier branches using two different design-extension techniques. A first design-extension technique is to replace the main amplifier branch of the two-way design by another two-way Doherty architecture; the second design-extension technique is to replace the peak amplifier branch of the two-way design by another two-way Doherty architecture. These two different design-extension techniques can be repeated one or more times to generate N-way Doherty amplifiers having a main amplifier branch and N-1 peak amplifier branches, where N≥3. In general, any branch in an (N-1)-way Doherty amplifier can be replaced by a two-way Doherty amplifier to obtain an N-way Doherty amplifier.

Figure 4:
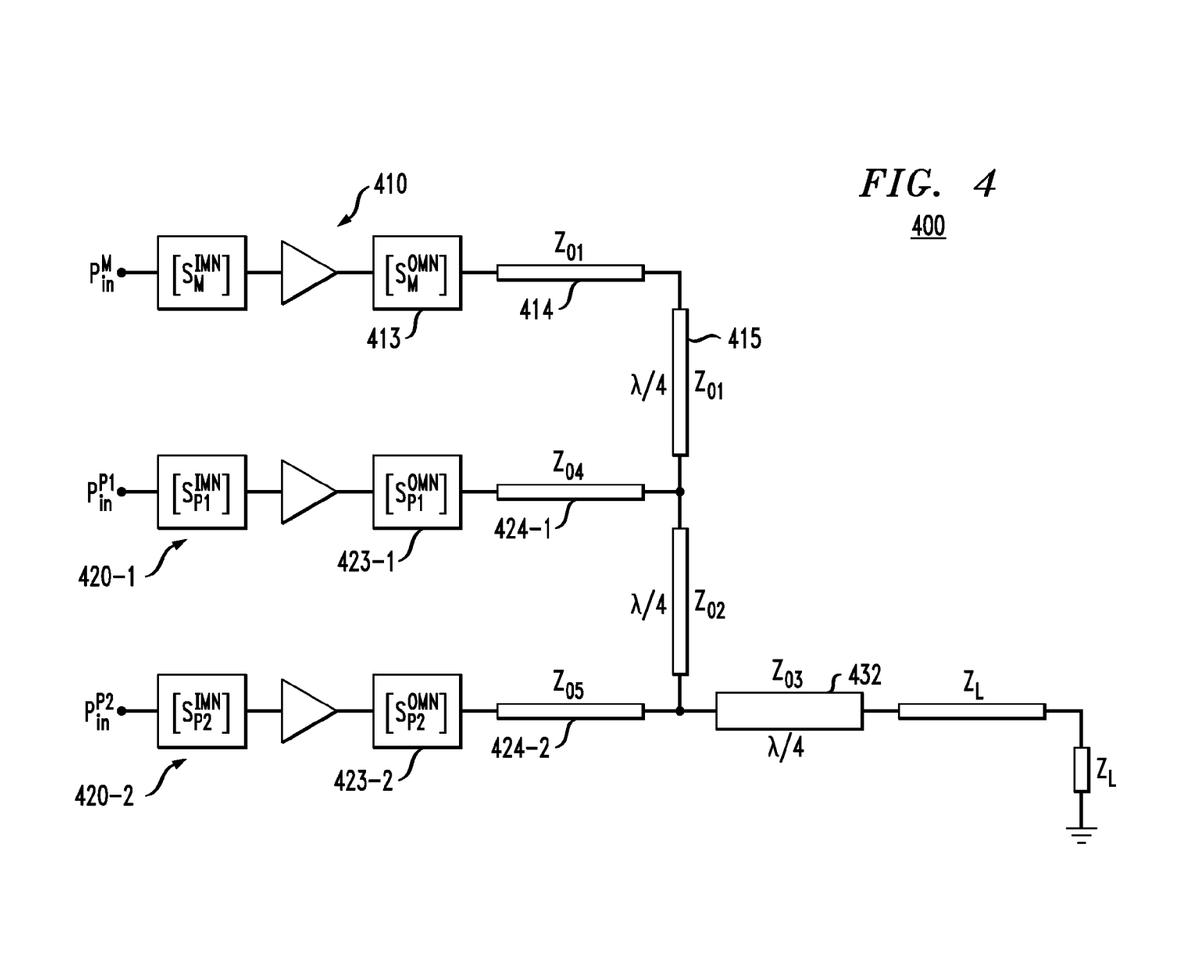
FIG. 4 shows a block diagram of a three-way Doherty amplifier designed using a first design-extension technique.

FIG. 4 shows a block diagram of a three-way Doherty amplifier 400 having a main amplifier branch 410 and two peak amplifier branches 420-1 and 420-2 designed using the first design-extension technique. In this case, three-way Doherty amplifier 400 was generated by replacing main amplifier branch 110 of two-way Doherty amplifier 100 of FIG. 1 with another two-way Doherty amplifier consisting of main amplifier branch 410 and peak amplifier branch 420-1, where peak amplifier branch 420-2 of FIG. 4 corresponds to peak amplifier branch 120 of FIG. 1.

Figure 5:
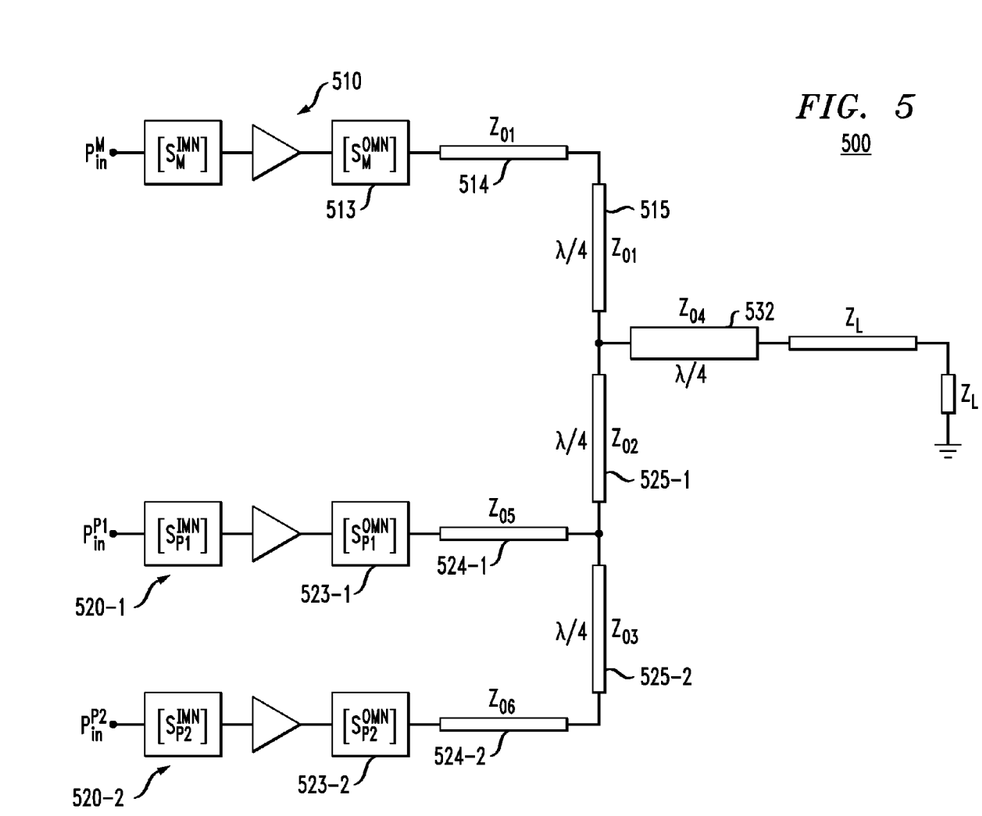
FIG. 5 shows a block diagram of a three-way Doherty amplifier designed using a second design-extension technique.

Similarly, FIG. 5 shows a block diagram of a three-way Doherty amplifier 500 having a main amplifier branch 510 and two peak amplifier branches 520-1 and 520-2 designed using the second design-extension technique. In this case, three-way Doherty amplifier 500 was generated by replacing peak amplifier branch 120 of two-way Doherty amplifier 100 of FIG. 1 with another two-way Doherty amplifier consisting of peak amplifier branch 520-1 (corresponding to the "peak amplifier branch" of the additional two-way Doherty amplifier) and peak amplifier branch 520-2 (corresponding to the "main amplifier branch" of the additional two-way Doherty amplifier), where main amplifier branch 510 of FIG. 5 corresponds to main amplifier branch 110 of FIG. 1.

Figure 6:
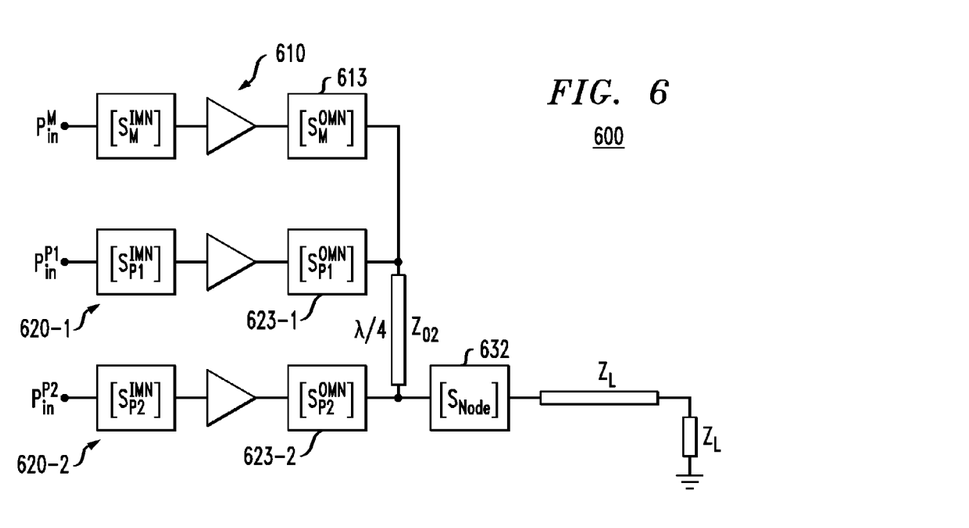
FIG. 6 shows a block diagram of a three-way Doherty amplifier according to one embodiment of the disclosure.

FIG. 6 shows a block diagram of a three-way Doherty amplifier 600 according to one embodiment of the disclosure having a main amplifier branch 610 and two peak amplifier branches 620-1 and 620-2. Three-way Doherty amplifier 600 corresponds to three-way Doherty amplifier 400 of FIG. 4, where the functionality and structure of the cascade of main output matching network 413, main offset line 414, and quarter-wave transformer 415 of FIG. 4 are subsumed into output matching network 613 of FIG. 6. Similarly, the functionality and structure of each cascade of peak output matching network 423-i and peak offset line 424-i of FIG. 4 are subsumed into the corresponding peak output matching network 623-i of FIG. 6. Furthermore, quarter-wave transformer 432 of FIG. 4 is replaced by wideband node matching network 632 of FIG. 6.

Using the first design-extension technique described earlier, three-way Doherty amplifier 600 of FIG. 6 may be generated by replacing the main amplifier branch 210 of two-way Doherty amplifier 200 of FIG. 2 with another two-way Doherty amplifier.

Figure 7:
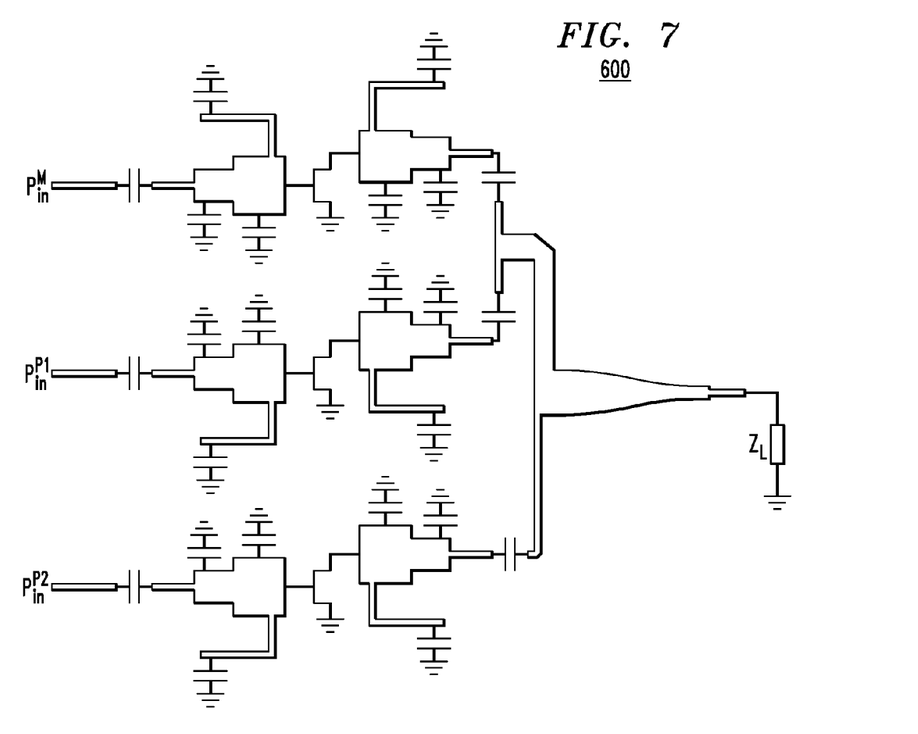
FIG. 7 shows a schematic diagram of the layout of one possible implementation of the three-way Doherty amplifier of FIG. 6.

FIG. 7 shows a schematic diagram of the layout of one possible implementation of three-way Doherty amplifier 600 of FIG. 6.

Figure 8:
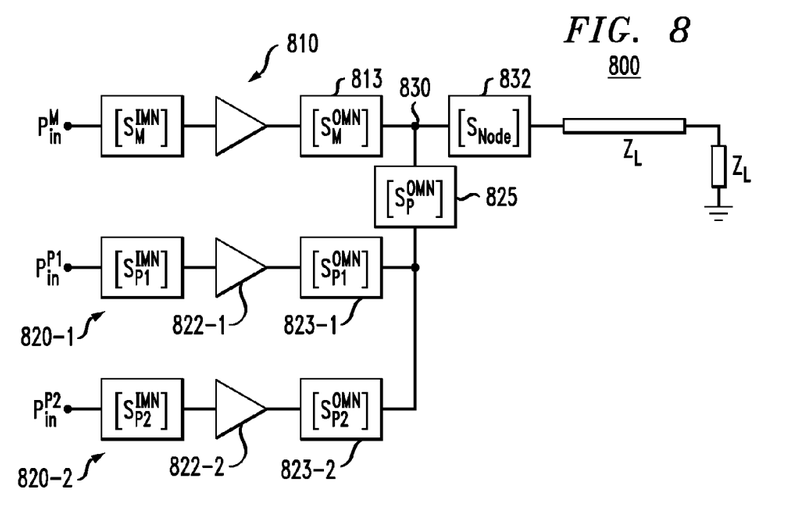
FIG. 8 shows a block diagram of a three-way Doherty amplifier according to another embodiment of the disclosure.

FIG. 8 shows a block diagram of a three-way Doherty amplifier 800 according to another embodiment of the disclosure having a main amplifier branch 810 and two peak amplifier branches 820-1 and 820-2. Three-way Doherty amplifier 800 corresponds to three-way Doherty amplifier 500 of FIG. 5, where the functionality and structure of the cascade of main output matching network 513, main offset line 514, and quarter-wave transformer 515 of FIG. 5 are subsumed into output matching network 813 of FIG. 8. Similarly, the functionality and structure of the cascade of peak output matching network 523-1 and peak offset line 524-1 of FIG. 5 are subsumed into the output matching network 823-2 of FIG. 8, the functionality and structure of the cascade of peak output matching network 523-2 and peak offset line 524-2 as well as quarter-wave transformer 525-2 of FIG. 5 are subsumed into the output matching network 823-1 of FIG. 8, and quarter-wave transformer 525-1 of FIG. 5 is replaced by common peak output matching network 825 of FIG. 8, which performs necessary impedance transformations under both low output power and high output power conditions. Furthermore, quarter-wave transformer 532 of FIG. 5 is replaced by wideband node matching network 832 of FIG. 8. Note that peak amplifier branch 820-1 of FIG. 8 corresponds to peak amplifier branch 520-2 of FIG. 5, and peak amplifier branch 820-2 of FIG. 8 corresponds to peak amplifier branch 520-1 of FIG. 5.

The first peak output matching network 823-1 converts the OFF-state impedance of the first peak amplifier device 822-1 to short circuit (low impedance), and it converts the load impedance seen by the first peak amplifier branch 820-1 under maximum power condition into high-power impedance for first peak amplifier device. The second peak output matching network 823-2 converts the OFF-state impedance of the second peak amplifier device 822-2 to open circuit (high impedance), and it converts the load impedance seen by the second peak amplifier branch 820-2 under maximum power condition into high-power impedance for second peak amplifier device.

Similarly, common peak output matching network 825 converts the parallel combination of the OFF-state impedances from the peak amplifier branches 820-1 and 820-2 into open circuit (high impedance) at combining node 830, and it converts the load impedance seen at combining node 830 under maximum power condition into a value equal to the parallel connection of the load impedances of branches 820-1 and 820-2. In other words, what peak networks 823-1 and 823-2 do for individual peak branches, common network 825 does for the "parallel" connection of the peak branches.

Using the second design-extension technique described earlier, three-way Doherty amplifier 800 of FIG. 8 may be generated by replacing the peak amplifier branch 220 of two-way Doherty amplifier 200 of FIG. 2 with another two-way Doherty amplifier.

Figure 9:
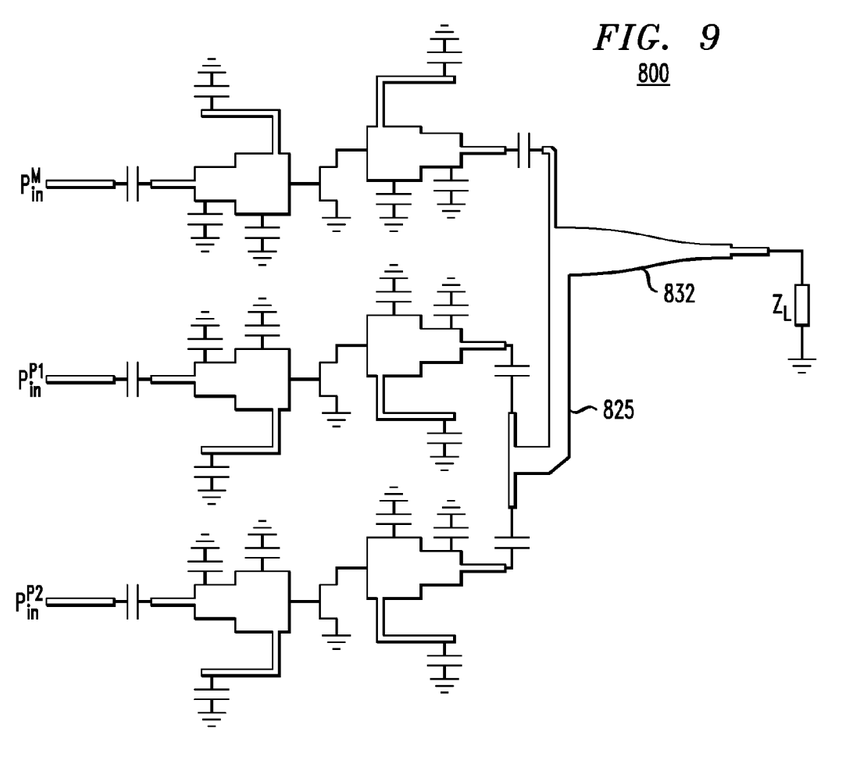
FIG. 9 shows a schematic diagram of the layout of one possible implementation of the three-way Doherty amplifier of FIG. 8.

FIG. 9 shows a schematic diagram of the layout of one possible implementation of three-way Doherty amplifier 800 of FIG. 8.

Figure 10:
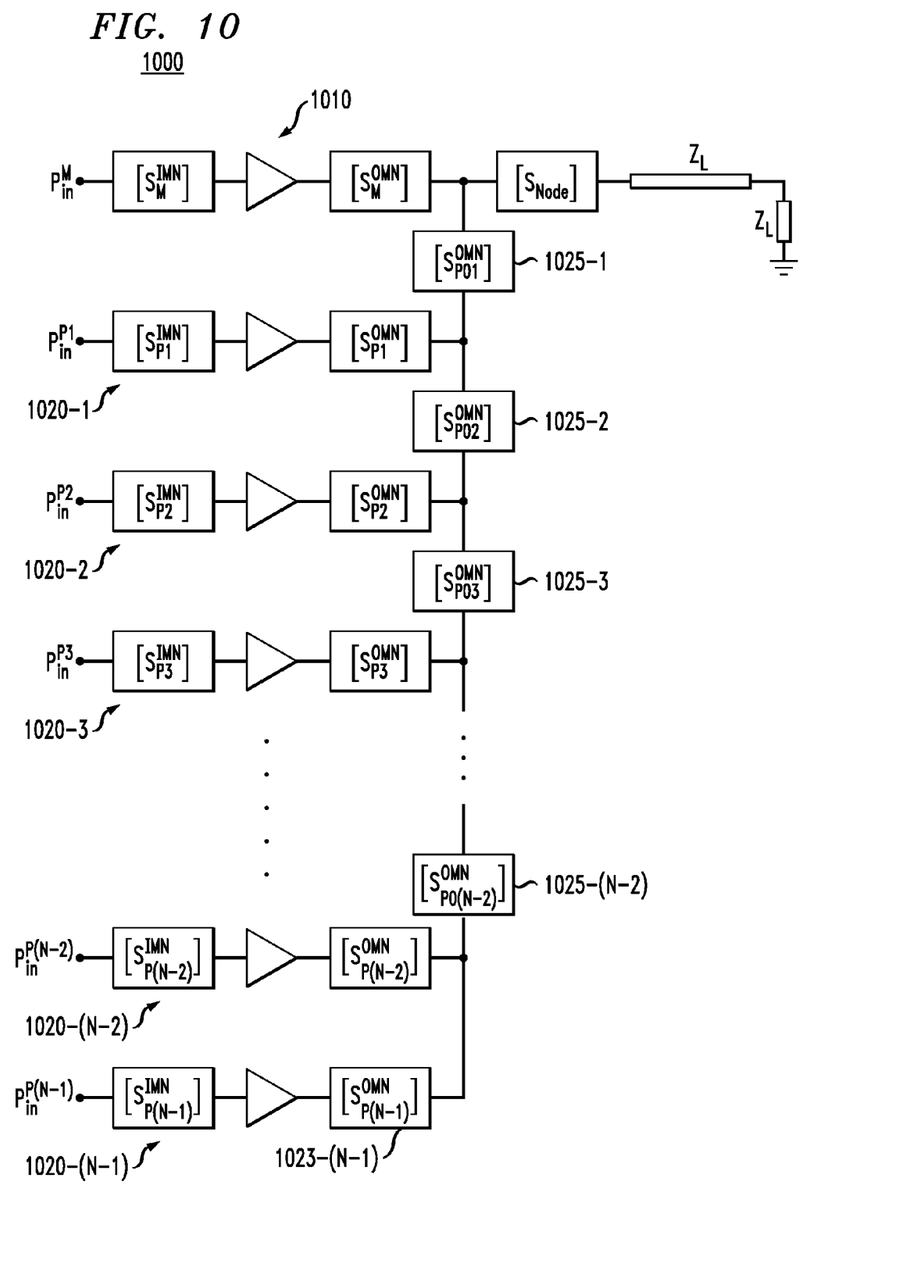
FIG. 10 shows a block diagram of a generic N-way Doherty amplifier of the disclosure, where N≥3, obtained from an (N-1)-way Doherty by replacing the last peak branch by another two-way Doherty.

As shown in FIG. 10, the architecture of three-way Doherty amplifier 800 of FIG. 8 can be extended to a generic N-way Doherty amplifier 1000 of the disclosure having a main amplifier branch 1010 and (N-1) peak amplifier branches 1020-1 to 1020-(N-1), where N≥3, using the second design-extension technique by repeatedly replacing the last peak amplifier branch by another two-way Doherty amplifier. Extending the design by replacing the last peak amplifier branch by another two-way amplifier has a consequence that the peak devices that turn on earlier are closer to the main combining node, which is desirable.

Note that, in FIG. 10, (i) the first peak amplifier branch 1020-1 is connected to the main amplifier branch 1010 by a first common peak output matching network 1025-1 and (ii) each other peak amplifier branch 1020-i is connected to its preceding peak amplifier branch 1020-(i-1) by a common peak output matching network 1025-i, except for the last two peak amplifier branches 1020-(N-2) and 1020-(N-1), which are not interconnected by a corresponding common peak output matching network. The functionality of that last common peak output matching network may be said to be subsumed the peak output matching network 1023-(N-1) of the last peak amplifier branch 1020-(N-1). In an alternative architecture of an N-way Doherty amplifier of the disclosure, there is a peak output matching network interconnecting the last two peak amplifier branches.

While this invention has been described with reference to illustrative embodiments, this description is not intended to be construed in a limiting sense.

Various modifications of the described embodiments, as well as other embodiments of the invention, which are apparent to persons skilled in the art to which the invention pertains are deemed to lie within the principle and scope of the invention as expressed in the following claims.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

What is claimed is:

1. Apparatus having an amplifier comprising:
   a node matching network connected to an output node of the amplifier;
   a first peak amplifier branch connected to an input node of the node matching network; and
   a main amplifier branch (i) connected to the input node of the node matching network and (ii) comprising:
   a main input matching network;
   a main amplifier device connected to the main input matching network; and
   a main output matching network (i) connected to the main amplifier device and (ii) configured to perform both an impedance transformation function and an impedance inversion function for the amplifier.

2. The invention of claim 1, wherein the main output matching network is connected to the node matching network without an intervening quarter-wave transformer for the amplifier.

3. The invention of claim 1, wherein the main output matching network is connected to the node matching network without an intervening main offset line for the amplifier.

4. The invention of claim 1, wherein the first peak amplifier branch comprises:
   a peak input matching network;
   a peak amplifier device connected to the peak input matching network; and
   a peak output matching network connected to the peak amplifier device.

5. The invention of claim 4, wherein the peak output matching network is configured to perform an impedance transformation function for the amplifier but not an impedance inversion function for the amplifier.

6. The invention of claim 4, wherein the peak output matching network is connected to the node matching network without an intervening peak offset line for the amplifier.

7. The invention of claim 1, wherein the amplifier further comprises:
   a second peak amplifier branch, wherein the first and second peak amplifier branches are connected to the input node of the node matching network via a first common peak output matching network.

8. The invention of claim 1, wherein the amplifier further comprises:
   a second peak amplifier branch, wherein the main amplifier branch and the first peak amplifier branch are connected to the input node of the node matching network via a quarter-wave transformer.

9. The invention of claim 1, wherein the amplifier comprises N-1 peak amplifier branches, N≥3, wherein:
   the first peak amplifier branch is connected to the input node of the node matching network via a first common peak output matching network.

10. The invention of claim 9, wherein:
    the (N-1)th peak amplifier branch is connected to the (N-2)th peak amplifier branch without an intervening common peak output matching network; and
    each other peak amplifier branch is connected to its preceding peak amplifier branch via a corresponding common peak output matching network.

11. The invention of claim 9, wherein:
    each other peak amplifier branch is connected to its preceding peak amplifier branch via a corresponding common peak output matching network.

12. The invention of claim 1, wherein the node matching network does not perform an impedance inversion function for the amplifier.

13. The invention of claim 1, wherein the node matching network comprises a transmission line having a tapered topology for wideband amplifier operation.

14. The invention of claim 1, wherein the amplifier is an N-way amplifier comprising the main amplifier branch and N-1 peak amplifier branches, N≥3, wherein the N-way amplifier is designed by replacing the main amplifier branch of an (N-1)-way amplifier with a two-way amplifier.

15. The invention of claim 1, wherein the amplifier is an N-way amplifier comprising the main amplifier branch and N-1 peak amplifier branches, N≥3, wherein the N-way amplifier is designed by replacing the (N-2)th peak amplifier branch of an (N-1)-way amplifier with a two-way amplifier.

16. The invention of claim 1, wherein the amplifier is a Doherty amplifier.

17. The invention of claim 1, wherein the apparatus is an integrated circuit.

18. The invention of claim 1, wherein:
the apparatus is an integrated circuit;
the amplifier is a Doherty amplifier;
the main output matching network is connected to the node matching network without an intervening quarter-wave transformer for the amplifier and without an intervening main offset line for the amplifier;
the first peak amplifier branch comprises:
a peak input matching network;
a peak amplifier device connected to the peak input matching network; and
a peak output matching network connected to the peak amplifier device and configured to perform an impedance transformation function for the amplifier but not an impedance inversion function for the amplifier;
the peak output matching network is connected to the node matching network without an intervening peak offset line for the amplifier;
the node matching network does not perform an impedance inversion function for the amplifier; and
the node matching network comprises a transmission line having a tapered topology for wideband amplifier operation.

19. The invention of claim 18, wherein the amplifier is an N-way amplifier comprising the main amplifier branch and N-1 peak amplifier branches, N≥3, wherein:
the N-way amplifier is designed by replacing the (N-2)th peak amplifier branch of an (N-1)-way amplifier with a two-way amplifier;
the first peak amplifier branch is connected to the input node of the node matching network via a first common peak output matching network;
the (N-1)th peak amplifier branch is connected to the (N-2)th peak amplifier branch without an intervening common peak output matching network; and
each other peak amplifier branch is connected to its preceding peak amplifier branch via a corresponding common peak output matching network.

* * * * *

UNITED STATES PATENT AND TRADEMARK OFFICE
CERTIFICATE OF CORRECTION

| | | |
|---|---|---|
| PATENT NO. | : 8,653,889 B1 | Page 1 of 1 |
| APPLICATION NO. | : 13/605106 | |
| DATED | : February 18, 2014 | |
| INVENTOR(S) | : Igor Acimovic et al. | |

It is certified that error appears in the above-identified patent and that said Letters Patent is hereby corrected as shown below:

Title Page, Item (75) Inventors, please replace "Igo Acimovic" with --Igor Acimovic--

Signed and Sealed this
Ninth Day of December, 2014

Michelle K. Lee
*Deputy Director of the United States Patent and Trademark Office*